(12) United States Patent
Chen

(10) Patent No.: US 8,115,522 B2
(45) Date of Patent: Feb. 14, 2012

(54) FLIP-FLOP CIRCUIT AND PRESCALER CIRCUIT INCLUDING THE SAME

(75) Inventor: Jia Chen, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 39 days.

(21) Appl. No.: 12/765,601

(22) Filed: Apr. 22, 2010

(65) Prior Publication Data

US 2010/0271083 A1     Oct. 28, 2010

(30) Foreign Application Priority Data

Apr. 23, 2009     (JP) .................................. 2009-104829

(51) Int. Cl.
*H03B 19/06*     (2006.01)
*H03K 3/356*     (2006.01)

(52) U.S. Cl. ........ 327/118; 327/115; 327/117; 327/202; 327/203; 327/207; 327/208; 327/212; 327/218; 327/225; 377/47

(58) Field of Classification Search .......... 327/113–115, 327/117, 118, 202, 203, 207–212, 218, 225; 377/47, 48

See application file for complete search history.

(56) References Cited

U.S. PATENT DOCUMENTS

| 4,234,849 | A | * | 11/1980 | Crilly, Jr. | 377/110 |
|---|---|---|---|---|---|
| 4,585,957 | A | * | 4/1986 | Ooms | 326/126 |
| 6,072,850 | A | * | 6/2000 | Ueno | 377/47 |
| 6,614,870 | B1 | * | 9/2003 | Miller | 377/48 |
| 6,917,662 | B2 | * | 7/2005 | Austin et al. | 377/47 |
| 2006/0087350 | A1 | * | 4/2006 | Ruffieux | 327/117 |

FOREIGN PATENT DOCUMENTS

| JP | 06-258465 A | 9/1994 |
|---|---|---|
| JP | 2005-303884 A | 10/2005 |

* cited by examiner

*Primary Examiner* — Patrick O'Neill
(74) *Attorney, Agent, or Firm* — Sughrue Mion, PLLC

(57) ABSTRACT

A prescaler circuit according to an exemplary aspect of the present invention includes a first flip-flop circuit that detects second output data and outputs the detected data as first output data, and a second flip-flop circuit that detects the first output data and outputs the data as the second output data. The first flip-flop circuit includes a master-side latch circuit that generates intermediate data, a slave-side latch circuit that detects the intermediate data and outputs the data as the first output data, and a control signal switching circuit that selects and outputs the first output data as a control signal in a mode where the frequency is divided by 3, and selects and outputs a predefined fixed signal as a control signal in a mode where the frequency is divided by 4. The master-side latch circuit generates the intermediate data based on the second output data and the control signal.

10 Claims, 5 Drawing Sheets

_US 8,115,522 B2_

FLIP-FLOP CIRCUIT AND PRESCALER CIRCUIT INCLUDING THE SAME

INCORPORATION BY REFERENCE

This application is based upon and claims the benefit of priority from Japanese patent application No. 2009-104829, filed on Apr. 23, 2009, the disclosure of which is incorporated herein in its entirety by reference.

BACKGROUND

1. Field of the Invention

The present invention relates to a flip-flop circuit and a prescaler circuit including the same.

2. Description of Related Art

In recent years, miniaturization and reduction in weight of devices have been in progress in mobile communications terminals. Thus, higher integration and miniaturization of semiconductor integrated circuits that constitutes such devices are also required. A PLL circuit which is provided in the semiconductor integrated circuit is composed of source coupled logic (SCL) circuits with use of Bi-CMOS process technique. Thus, the PLL circuit is able to operate in high speed. However, from demands in the market described above, lower voltage, lower current consumption and higher speed in operation are required for the PLL circuit. Note that a prescaler circuit provided in the PLL circuit is a circuit that operates in high speed to control the operating frequency of the PLL circuit. Therefore, the prescaler circuit influences the current consumption of the PLL circuit.

FIG. 3 is a block diagram showing a prescaler circuit 200 for dividing the frequency of a clock signal by an integer 3 or 4 according to a related art. Hereinafter, a frequency division ratio is expressed as 1/n when divided by n (n is a natural number) by the prescaler circuit.

That is, FIG. 3 is a block diagram showing the prescaler circuit 200 for dividing the frequency of a clock signal with either of the frequency division ratios 1/3 and 1/4. Further, FIG. 4 is a circuit diagram showing a transistor configuration of a NOR circuit provided in a logic control circuit 2. Further, FIG. 5 is a circuit diagram showing a transistor configuration of a conventional flip-flop circuit provided in a flip-flop circuit group 1.

In the prescaler circuit 200 shown in FIG. 3, the flip-flop circuit group 1 is provided with a flip-flop circuit 100 and a flip-flop circuit 101 connected in cascade with each other. Further, the logic control circuit 2 is provided with a NOR circuit 102 and a NOR circuit 103. The high potential side power supply terminal of each of the flip-flop circuits 100 and 101 is connected to a power supply voltage terminal VDD. The low potential side power supply terminal of each of the flip-flop circuits 100 and 101 is connected to a ground voltage terminal GND. Note that, though not shown in FIG. 3, the high potential side power supply terminal of each of the NOR circuits 102 and 103 is connected to the power supply voltage terminal VDD. The low potential side power supply terminal of each of the NOR circuits 102 and 103 is connected to the ground voltage terminal GND.

Clock terminals Clock and Clock_b of the prescaler circuit 200 are connected to corresponding clock input terminals CK and CK_b of the flip-flop circuits 100 and 101. An output terminal Dout of the flip-flop circuit 100 is connected to an input terminal Din of the flip-flop circuit 101. An output terminal Dout_b of the flip-flop circuit 100 is connected to an input terminal Din_b of the flip-flop circuit 101 and an input terminal A of the NOR circuit 102. An output terminal Dout of the flip-flop circuit 101 is connected to an output terminal Dout of the prescaler circuit 200 and an input terminal B of the NOR circuit 103.

An output terminal Dout_b of the flip-flop circuit 101 is connected to an output terminal Dout_b of the prescaler circuit 200. An input terminal CTL of the prescaler circuit 200 is connected to an input terminal B of the NOR circuit 102. An output terminal Y of the NOR circuit 102 is connected to an input terminal A of the NOR circuit 103. An output terminal Y of the NOR circuit 103 is connected to an input terminal Din of the flip-flop circuit 100. An output terminal Y_b of the NOR circuit 103 is connected to an input terminal Din_b of the flip-flop circuit 100. Note that, for example, a signal named "Dout" and a signal named "Dout_b" (added "_b" to "Dout") constitute a pair of differential signals. The other signals also constitute a pair of differential signals when expressed in the same fashion.

The output terminals Dout and Dout_b of the prescaler circuit 200 are connected to an external synchronous counter (not shown), for example. Counting bits of this counter is input to the input terminal CTL of the prescaler circuit 200 as a switching control signal for switching the frequency division ratio of the prescaler circuit 200. The logic control circuit 2 outputs a logic operation result obtained based on output data of the flip-flop circuit 100, output data of the flip-flop circuit 101, and the switching control signal as a feedback signal to the flip-flop circuit 100. Note that the frequency division ratio of the prescaler circuit 200 is switched as a result of the change of the logic operation result based on the switching control signal. Note that the configuration of the prescaler circuit as described above is disclosed in Japanese Unexamined Patent Application Publication No. 6-258465.

For example, when the switching control signal output from the synchronous counter (not shown) is H level, the prescaler circuit 200 indicates the frequency division ratio 1/4. In contrast, when the switching control signal output from the synchronous counter is L level, the prescaler circuit 200 indicates the frequency division ratio 1/3.

Referring next to FIG. 5, a circuit configuration and an operation of the flip-flop circuit of the related art will be described.

FIG. 5 is a circuit diagram showing a circuit configuration of a conventional flip-flop circuit formed by using Bi-CMOS technique. In the circuit shown in FIG. 5, transistors 5 to 8 are N-channel MOS transistors. Transistors 9 to 16 are NPN-type bipolar transistors. Note that the on-off state of each of the transistors 5 to 8 is controlled by a clock signal CK or a clock signal CK_b which is the inverted signal of the clock signal CK.

First, when the clock signal CK is H level and the clock signal CK_b is L level, an externally-supplied input signal is applied to the base of each of the transistors 9 and 10 through the corresponding input terminals Din and Din_b. Then, the externally-supplied input signal is amplified by a first differential circuit composed of resistors 17 and 18 and the transistors 9 and 10.

Next, when the clock signal CK changes from H level to L level and the clock signal CK_b changes from L level to H level, the signal amplified by the first differential circuit is held by a second differential circuit composed of the transistors 11 and 12. That is, the resistors 17 and 18, the transistors 5 and 6, and the transistors 9 to 12 constitute the master-side latch circuit in the conventional flip-flop circuit.

The signal amplified by the first differential circuit is held by the second differential circuit, and is applied to the base of each of the transistors 13 and 14 at the same time. Then, the amplified signal is further amplified by a third differential circuit composed of resistors 19 and 20 and the transistors 13 and 14. Then, the signal amplified by the third differential circuit is applied to each of the output terminals Dout and Dout_b as an output signal of the flip-flop circuit.

Next, when the clock signal CK changes from L level to H level and the clock signal CK_b changes from H level to L level, the signal amplified by the third differential circuit is held by a fourth differential circuit composed of the transistors 15 and 16, and the signal held by the forth differential circuit is applied to each of the output terminals Dout and Dout_b as the output signal of the flip-flop circuit. That is, the resistors 19 and 20, the transistors 7 and 8, and the transistors 13 to 16 constitute the slave-side latch circuit in the conventional flip-flop circuit. Note that the configuration of the flip-flop circuit as described above is disclosed in Japanese Unexamined Patent Application Publication No. 2005-303884.

SUMMARY

The present inventors have found a problem described below. As described above, the prescaler circuit 200 shown in FIG. 3 operates in synchronization with the clock signals CK and CK_b. Therefore, it becomes more important to suppress the delay time required to transmit and receive the signal between the flip-flop circuit 100 and the flip-flop circuit 101 as the frequency of the clock signals CK and CK_b becomes higher. However, as described above, the prescaler circuit 200 is provided with the logic control circuit 2. Thus, the prescaler circuit 200 has a problem that the delay time required to transmit and receive the signal between the flip-flop circuit 100 and the flip-flop circuit 101 increases. Thereby, there has been a problem in the prescaler circuit in the related art that the frequency dividing cannot be accurately performed in a high-speed operation.

Moreover, the NOR circuit, which is composed of the SCL circuit, increases the power consumption in a high-speed operation. Thereby, there has been a problem that the prescaler circuit in the related art increases the power consumption in the high-speed operation.

As described above, there has been a problem in the prescaler circuit in the related art that, for example, the frequency dividing cannot be accurately performed in high-speed operation.

A first exemplary aspect of the present invention is a prescaler circuit that divides a frequency of a clock signal by an integer 3 or 4, including:

a first flip-flop circuit that detects second output data in synchronization with the clock signal and outputs the detected data as first output data; and a second flip-flop circuit that detects the first output data in synchronization with the clock signal and outputs the detected data as the second output data to the first flip-flop circuit. The first flip-flop circuit includes:

a master-side latch circuit that generates intermediate data in synchronization with the clock signal;

a slave-side latch circuit that detects the intermediate data in synchronization with the clock signal and outputs the detected intermediate data as the first output data; and a control signal switching circuit that selects and outputs the first output data as a control signal in a mode where the frequency is divided by 3, and selects and outputs a predefined fixed signal as a control signal in a mode where the frequency is divided by 4. The master-side latch circuit generates the intermediate data based on the second output data and the control signal.

A second exemplary aspect of the present invention is a flip-flop circuit including:

a master-side latch circuit that generates intermediate data in synchronization with a clock signal a slave-side latch circuit that detects the intermediate data in synchronization with the clock signal and outputs the detected intermediate data as the first output data; and a control signal switching circuit that selects and outputs the first output data as a control signal in a mode where the frequency is divided by 3, and selects and outputs a predefined fixed signal as a control signal in a mode where the frequency is divided by 4. The master-side latch circuit generates the intermediate data based on externally-supplied input data and the control signal.

With this circuit configuration, the frequency dividing can be accurately performed.

The present invention provides a flip-flop circuit and a prescaler circuit including the same that can perform accurate frequency dividing.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Figure 1:
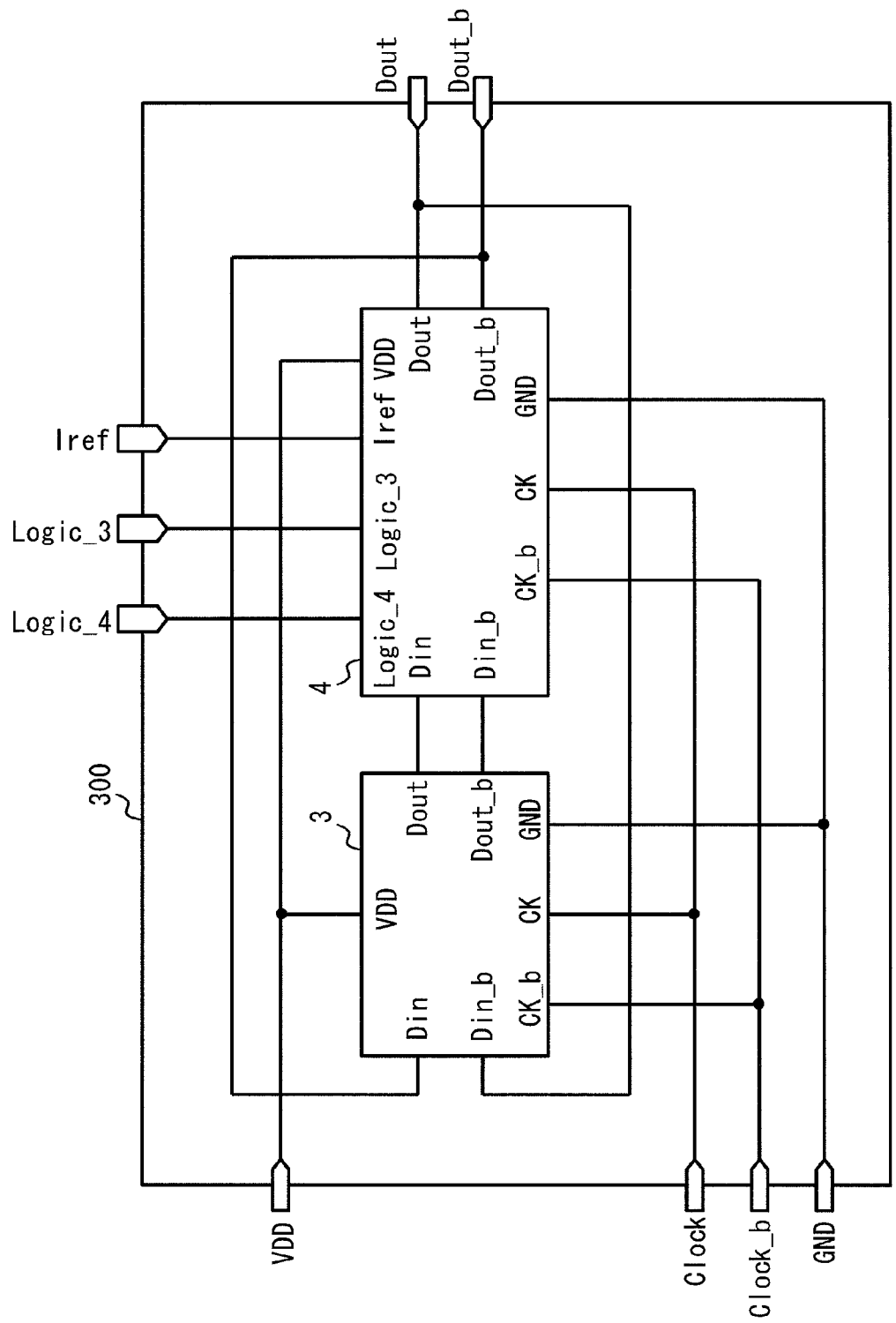
FIG. 1 illustrates a prescaler circuit according to a first exemplary embodiment of the present invention.

Specific exemplary embodiments incorporating the present invention are described in detail with reference to the drawings. The same components are denoted by the same reference numerals in the drawings, and for clarity of explanation, repeated explanation is omitted as appropriate.

First Exemplary Embodiment

Referring to FIG. 1, a circuit configuration and an operation of a prescaler circuit according to a first exemplary embodiment of the present invention will be described. FIG. 1 is a block diagram showing a prescaler circuit 300 according to the exemplary embodiment of the present invention. Note that the prescaler circuit 300 according to the exemplary embodiment of the present invention divides the frequency of a clock signal by an integer 3 or 4. Further, the prescaler circuit 300 according to the exemplary embodiment of the present invention is provided with an additional flip-flop circuit formed by the combination of a logic control circuit and a latch circuit. Hereinafter, frequency division ratio is expressed as 1/n when divided by n (n is a natural number) by the prescaler. That is, the prescaler circuit 300 divides the frequency of a clock signal with either of the frequency division ratios 1/3 and 1/4.

As shown in FIG. 1, the prescaler circuit 300 is provided with a conventional flip-flop circuit (second flip-flop circuit) 3 and a flip-flop circuit (first flip-flop circuit) 4 in accordance with an exemplary aspect of the present invention.

In the prescaler circuit 300 shown in FIG. 1, the high potential side power supply terminal of each of the flip-flop circuit 3 and 4 is connected to a power supply voltage terminal (second power supply terminal) VDD. Further, the low potential side power supply terminal of each of the flip-flop circuit 3 and 4 is connected to a ground voltage terminal (first power supply terminal) GND.

Clock terminals Clock and Clock_b of the prescaler circuit 300 are connected to corresponding clock input terminals CK and CK_b of the flip-flop circuits 3 and 4. An output terminal Dout of the flip-flop circuit 3 is connected to an input terminal Din of the flip-flop circuit 4. An output terminal Dout_b of the flip-flop circuit 3 is connected to an input terminal Din_b of the flip-flop circuit 4. An output terminal Dout of the flip-flop circuit 4 is connected to an output terminal Dout of the prescaler circuit 300 and an input terminal Din_b of the flip-flop circuit 3. An output terminal Dout_b of the flip-flop circuit 4 is connected to an output terminal Dout_b of the prescaler circuit 300 and an input terminal Din of the flip-flop circuit 4.

An input terminal Logic_3 of the prescaler circuit 300 is connected to an input terminal Locig_3 of the flip-flop circuit 4. An input terminal Logic_4 of the prescaler circuit 300 is connected to an input terminal Locig_4 of the flip-flop circuit 4. An input terminal Iref of the prescaler circuit 300 is connected to an input terminal Iref of the flip-flop circuit 4. Note that, for example, a signal named "Dout" and a signal named "Dout_b" (added "_b" to "Dout") constitute a pair of differential signals. The other signals also constitute a pair of differential signals when expressed in the same fashion.

The output terminals Dout and Dout_b of the prescaler circuit 300 are connected to an external synchronous counter (not shown), for example. Counting bits of this counter is input to the input terminal Logic_3 and the input terminal Logic_4 of the prescaler circuit 300 as a switching control signal for switching the frequency division ratio of the prescaler circuit 300.

For example, when the signal input to the input terminal Logic_4 is H level and the signal input to the input terminal Logic_3 is L level based on the switching control signal, the prescaler circuit 300 indicates the frequency division ratio 1/4. In contrast, when the signal input to the input terminal Logic_4 is L level and the signal input to the input terminal Logic_3 is H level based on the switching control signal, the prescaler circuit 300 indicates the frequency division ratio 1/3.

An externally supplied clock signal CK is input to the clock input terminal CK of the flip-flop circuit 4 and the clock input terminal CK of the flip-flop circuit 3 through the clock terminal Clock of the prescaler circuit 300. An externally supplied clock signal CK_b is input to the clock input terminal CK_b of the flip-flop circuit 4 and the clock input terminal CK_b of the flip-flop circuit 3 through the clock terminal Clock_b of the prescaler circuit 300. Note that the clock signal CK_b is the inverted signal of the clock signal CK. Further, a signal Iref is input to the input terminal Iref of the flip-flop circuit 4 as a bias voltage of an internal logic circuit of the flip-flop circuit 4.

Figure 2:
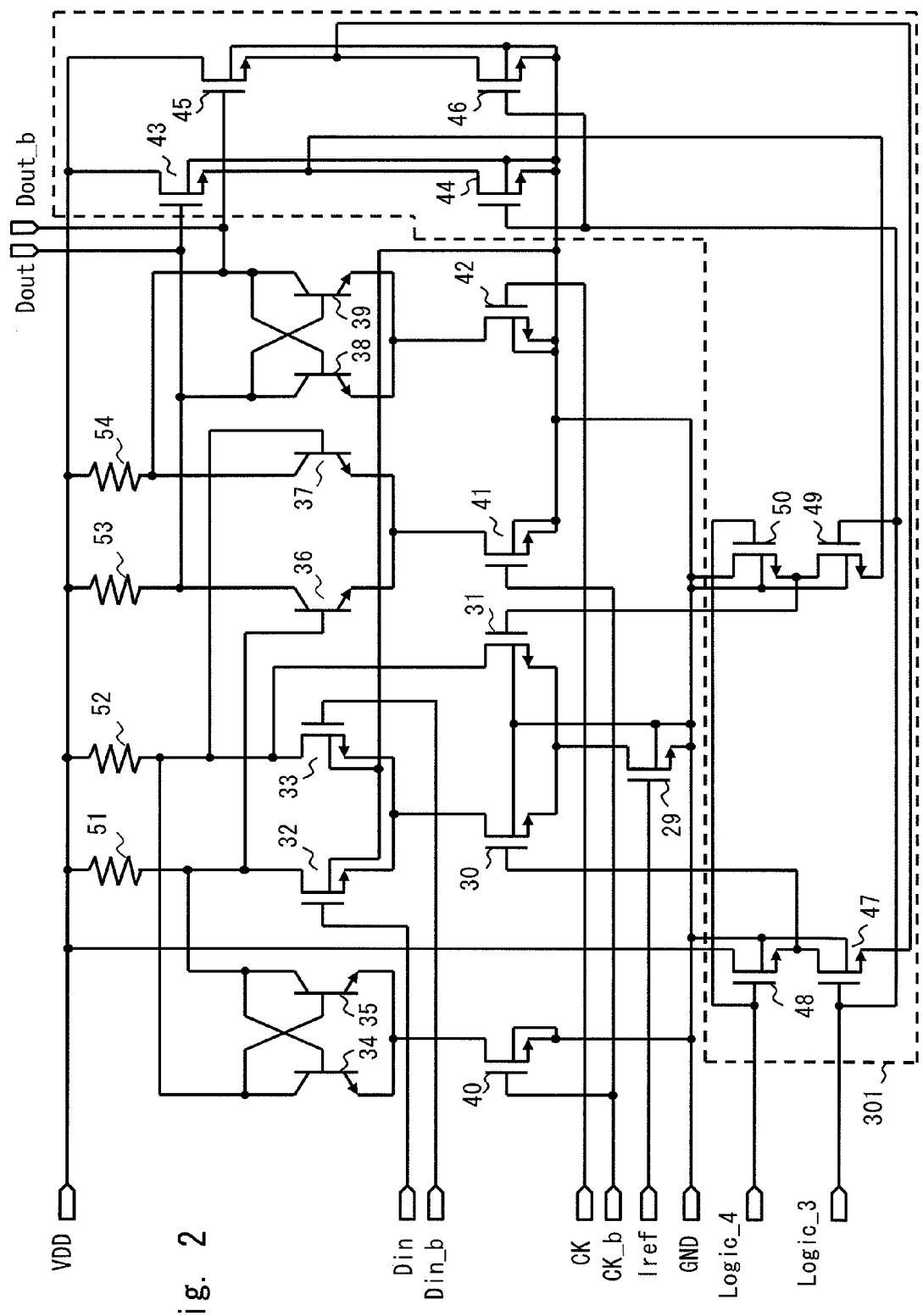
FIG. 2 illustrates a flip-flop circuit according to a first exemplary embodiment of the present invention.
Figure 3:
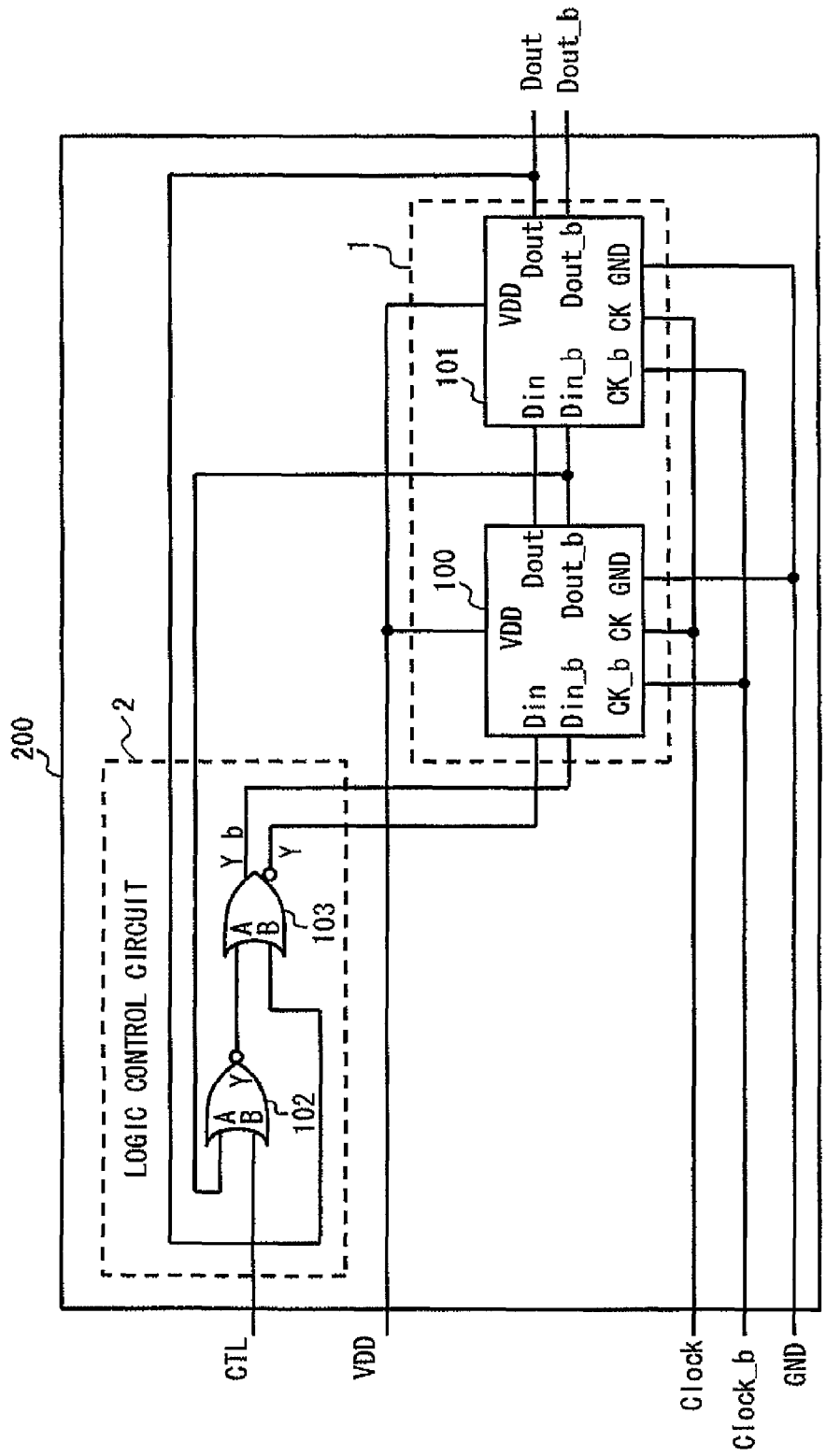
FIG. 3 illustrates a prescaler circuit according to the related art.
Figure 4:
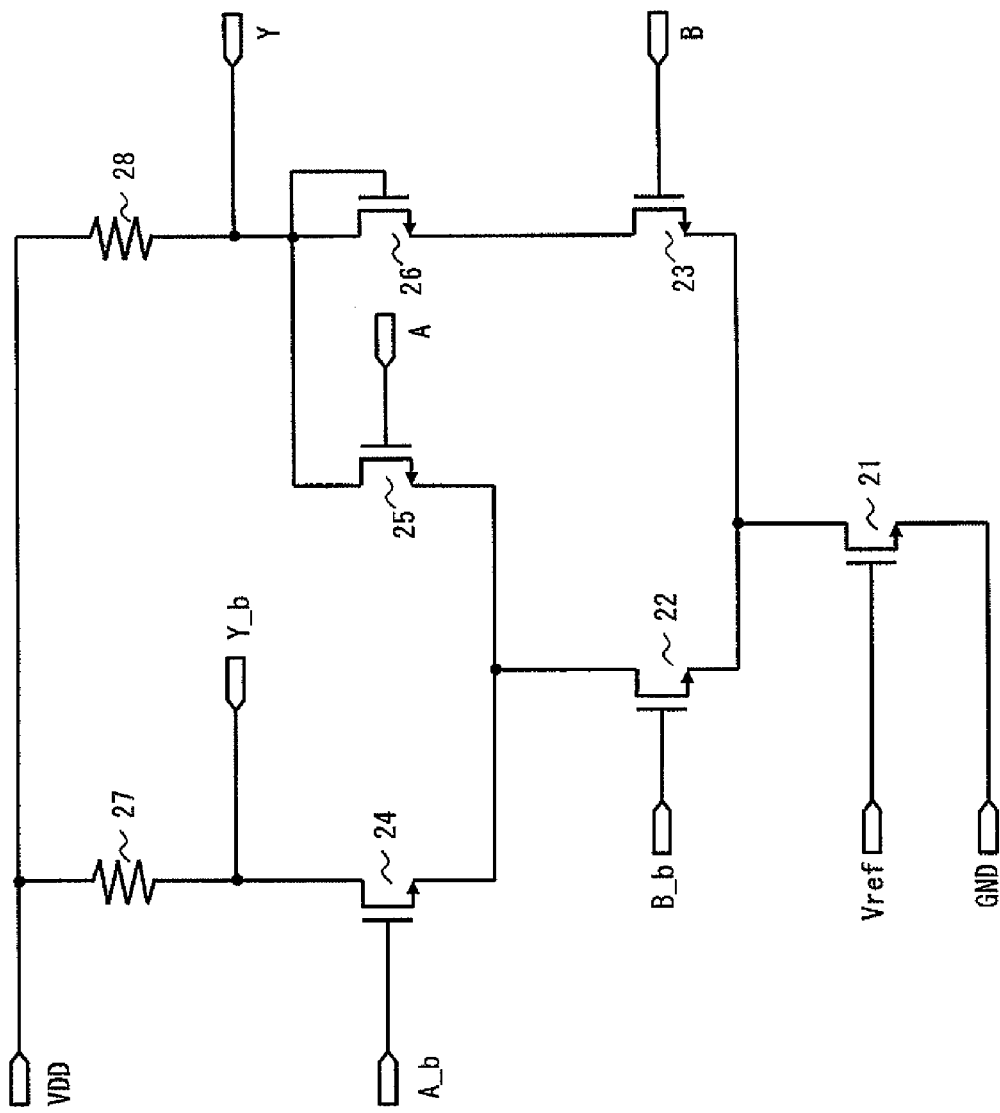
FIG. 4 illustrates a logic control circuit according to the related art.
Figure 5:
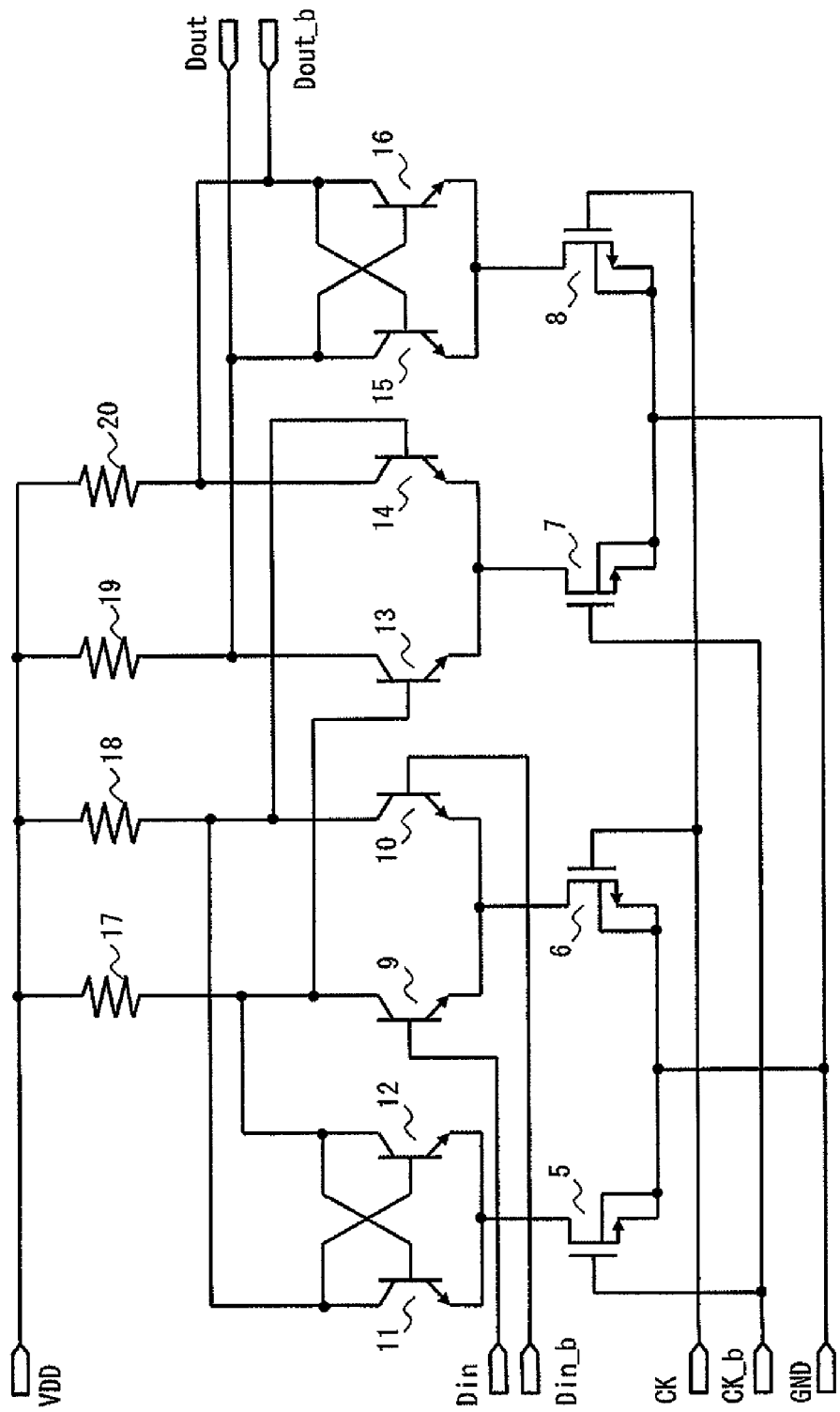
FIG. 5 illustrates a flip-flop circuit according to the related art.

FIG. 5 is a circuit diagram showing a circuit configuration of the flip-flop circuit 3 formed by using Bi-CMOS technique. FIG. 2 is a circuit diagram showing a circuit configuration of the flip-flop circuit 4 according to the exemplary embodiment of the present invention. The flip-flop circuit 3 is a conventional flip-flop circuit. Note that the circuit configuration and the operation of the flip-flop circuit 3 are same as those described above with the related art, and thus explanation is omitted. Referring next to FIG. 2, a circuit configuration and an operation of the flip-flop circuit 4 according to the exemplary embodiment of the present invention will be described.

FIG. 2 is a circuit diagram showing a circuit configuration of the flip-flop circuit formed by using Bi-CMOS technique. The circuit shown in FIG. 2 is provided with transistors 29 to 42 (The transistor 30 corresponds to a first transistor in the claims; The transistor 31 corresponds to a second transistor in the claims; The transistor 29 corresponds to a bias voltage control transistor in the claims). Further, the circuit is also provided with a control signal switching circuit 301 and resistors 51 to 54. Further, the control signal switching circuit 301 is provided with transistors 43 to 50. In this exemplary embodiment, a case is explained hereinafter in which the transistors 29 to 33 and the transistors 40 to 50 are N-channel MOS transistors. Further, a case is explained hereinafter in which the transistors 34 to 39 are NPN-type bipolar transistors.

First, the circuit configuration of the flip-flop circuit 4 will be described. The clock input terminal CK is connected to the gate of the transistor 42. The clock input terminal CK_b is connected to the gate of the transistor 40 and the gate of the transistor 41. The input terminal Iref is connected to the gate of the transistor 29. The power supply voltage terminal VDD is connected to the drain of the transistor 48, one terminal of the resistor 51, one terminal of the resistor 52, one terminal of the resistor 53, one terminal of the resistor 54, the drain of the transistor 43, and the drain of the transistor 45. The ground voltage terminal GND is connected to the source of the transistor 40, the source of the transistor 29, the source of the transistor 41, the source of the transistor 42, the source of the transistor 44, the source of the transistor 46, and the drain of the transistor 50.

The source of the transistor 30 is connected to the source of the transistor 31 and the drain of the transistor 29. The gate of the transistor 30 is connected to the source of the transistor 48 and the drain of the transistor 47. The drain of the transistor 30 is connected to the source of the transistor 32 and the source of the transistor 33.

The input terminal Din is connected to the gate of the transistor 32. The drain of the transistor 32 is the collector of the transistor 35, the base of the transistor 34, the base of the transistor 36, and the other terminal of the resistor 51. The input terminal Din_b is connected to the gate of the transistor 33. The drain of the transistor 33 is connected to the collector of the transistor 34, the base of the transistor 35, the base of the transistor 37, the other terminal of the resistor 52, and the drain of the transistor 31. A drain of the transistor 40 is connected to an emitter of the transistor 34 and an emitter of the transistor 35. A gate of the transistor 31 is connected to the drain of the transistor 49 and the source of the transistor 50.

The emitter of the transistor 36 is connected to an emitter of the transistor 37 and the drain of the transistor 41. The collector of the transistor 36 is connected to the other terminal of the resistor 53, the collector of the transistor 38, the base of the transistor 39, the gate of the transistor 43, and the output terminal Dout. The collector of the transistor 37 is connected to the other terminal of the resistor 54, the collector of the transistor 39, the base of the transistor 38, the gate of the transistor 45, and the output terminal Dout_b. An emitter of the transistor 38 is connected to an emitter of the transistor 39 and the drain of the transistor 42.

The source of the transistor 43 is connected to the drain of the transistor 44 and the source of the transistor 49. The source of the transistor 45 is connected to the drain of the transistor 46 and the source of the transistor 47. The input terminal Logic_3 is connected to the gate of the transistor 47, the gate of the transistor 49, the gate of the transistor 44, and the gate of the transistor 46. The input terminal Logic_4 is connected to the gate of the transistor 48 and the gate of the transistor 50.

Next, the operation of the flip-flop circuit 4 will be described. The on-off state of each transistor 40 to 42 is controlled by the clock signal CK or a clock signal CK_b which is the inverted signal of the clock signal CK. Note that the flip-flop circuit 4 can be modified as appropriate to a circuit configuration with which an additional transistor is provided between the common source of the transistors 32 and 33 and the ground voltage terminal GND. Note that the on-off state of the additional transistor is controlled by the clock signal CK.

When the prescaler circuit 300 indicates the frequency division ratio 1/4, the switching control signal Logic_4 is set to H level and the switching control signal Logic_3 is set to L level. In this case, in the flip-flop circuit 4 shown in FIG. 2, the transistors 48 and 50 are turned on and the transistors 47 and 49 are turned off. Thereby, the power supply voltage VDD is applied to the gate of the transistor 30 through the transistor 48. Then, the transistor 30 is turned on. Note that the transistor 30 which is in the on state, the transistor 29 of which the bias voltage Iref is applied to the gate, the transistors 32 and 33, and the resistors 51 and 52 constitute a bias circuit. In contrast, the ground voltage terminal GND is applied to the gate of the transistor 31 through the transistor 50. Then, the transistor 31 is turned off. Note that the resistors 51 and 52, and the transistors 32 and 33 constitute a first differential circuit. The transistors 30 and 31 constitute a second differential circuit.

First, when the clock signal CK is H level and the clock signal CK_b is L level, the externally supplied input signal is applied to the gate of each of the transistors 32 and 33 through the corresponding input terminal Din and Din_b. Then, the externally supplied input signal is amplified by the first differential circuit.

Next, when the clock signal CK changes from H level to L level and the clock signal CK_b changes from L level to H level, the signal amplified by the first differential circuit is held by a third differential circuit composed of the transistors 34 and 35. Note that first, second, and third differential circuits constitute a master-side latch circuit in the flip-flop circuit 4.

The signal amplified by the first differential circuit is held by the third differential circuit, and is applied to the base of each of the transistors 36 and 37 at the same time. Then, the amplified signal is further amplified by a fourth differential circuit composed of resistors 53 and 54 and the transistors 36 and 37. Then, the signal amplified by the fourth differential circuit is applied to each of the output terminals Dout and Dout_b as an output signal of the flip-flop circuit.

Next, when the clock signal CK changes from L level to H level and the clock signal CK_b changes from H level to L level, the signal amplified by the fourth differential circuit is held by a fifth differential circuit composed of the transistors 38 and 39, and the signal held by the fifth differential circuit is applied to each of the output terminals Dout and Dout_b as the output signal of the flip-flop circuit 4. That is, the fourth differential circuit and the fifth differential circuit constitute a slave-side latch circuit in the flip-flop circuit 4.

As described above, when the prescaler circuit 300 indicates the frequency division ratio 1/4, the flip-flop circuit 4 operates in the same manner as the conventional flip-flop circuit. The output signal output from the output terminal Dout of the flip-flop circuit 4 is input to the input terminal Din_b of the flip-flop circuit 3 as a feedback signal. The output signal output from the output terminal Dout_b of the flip-flop circuit 4 is input to the input terminal Din of the flip-flop circuit 3 as a feedback signal. Thus, the prescaler circuit 300 operates with the frequency division ratio 1/4.

Next, when the prescaler circuit 300 indicates the frequency division ratio 1/3, the switching control signal Logic_4 is set to L level and the switching control signal Logic_3 is set to H level. In this case, in the flip-flop circuit 4 shown if FIG. 2, the transistors 47 and 49 are turned on and the transistors 48 and 50 are turned off. Thereby, a voltage of a node between the source of the transistor 43 and the drain of the transistor 44 is applied to the gate of the transistor 31 through the transistor 49. Then, a voltage of a node between the source of the transistor 45 and the drain of the transistor 46 is applied to the gate of the transistor 30 through the transistor 47.

That is, an output driver circuit composed of the transistors 43 to 46 drives and outputs the output signals Dout and Dout_b of the flip-flop circuit 4. Then, the driven signals are applied to the gate of the corresponding transistors 30 and 31 through the corresponding transistors 47 and 49. Specifically, the output driver circuit drives and outputs the output signal Dout of the flip-flop circuit 4. Then, the driven signal is applied to the gate of the transistor 31 through the transistor 49. Further, the output driver circuit drives and outputs the output signal Dout_b of the flip-flop circuit 4. Then, the driven signal is applied to the gate of the transistor 30 through the transistor 47.

In this case, the transistors 29 to 33 and the resistors 51 and 52 constitute a NAND logic circuit. Specifically, the NAND logic circuit outputs a logic operation result obtained based on the output signals of the flip-flop circuit 3 and the output signals of the flip-flop circuit 4. Then, the logic operation result is held by the third differential circuit (transistor 34 and 35). After that, the logic operation result is applied to the output terminal Dout and Dout_b as a pair of the output signals Dout and Dout_b through the fourth differential circuit (transistor 36 and 37) and the fifth differential circuit (transistor 38 and 39) as in the case of the conventional flip-flop circuit described above.

As described above, when the prescaler circuit 300 indicates the frequency division ratio 1/3, in the flip-flop circuit 4, the logic operation is executed by the NAND logic circuit based on the output signals of the flip-flop circuit 3 and the output signals of the flip-flop circuit 4. Then, the flip-flop circuit 4 holds the logic operation result in the master-side latch circuit. After that, the flip-flop circuit 4 operates in the same manner as the conventional flip-flop circuit described above. Especially, the flip-flop circuit 4 according to the exemplary embodiment of the present invention is provided with the internal circuit having a function similar to that of the logic control circuit 2 of the related art. Therefore, there is no need to provide the prescaler circuit 300 according to the exemplary embodiment of the present invention with any logic control circuit corresponding to the logic control circuit 2 of the related art. Thus, the prescaler circuit 300 can suppress the delay time required to transmit and receive the signal between the flip-flop circuit 3 and the flip-flop circuit 4. Thereby, the prescaler circuit 300 can switch the frequency division ratio accurately in high-speed operation.

As described above, in the flip-flop circuit and the prescaler circuit including the same according to the exemplary embodiment of the present invention, the logic operation circuit (the NAND logic circuit) provided in the flip-flop circuit 4 is composed of a part of the master-side latch circuit of the flip-flop circuit 4. Especially, the flip-flop circuit 4 according to the exemplary embodiment of the present invention is provided with the internal circuit having a similar function to that of the logic control circuit 2 of the related art. Therefore, there is no need to provide the prescaler circuit 300 according to the exemplary embodiment of the present invention with any logic control circuit corresponding to the logic control circuit 2 of the related art. Thus, the prescaler circuit 300 can suppress the delay time required to transmit and receive the signal between the flip-flop circuit 3 and the flip-flop circuit 4. Thereby, the prescaler circuit 300 can switch the frequency division ratio accurately in high-speed operation. Moreover, the prescaler circuit 300 can reduce the power consumption because there is no need to include any logic control circuit corresponding to the logic control circuit 2 of the related art.

The prescaler circuit according to the exemplary embodiment of the present invention can operate in high speed and reduce the power consumption. Further, the prescaler circuit according to the exemplary embodiment of the present invention may have applicability to semiconductor integrated circuits for which lower voltage, lower current consumption and higher speed in operation are required.

Note that the present invention is not limited to the above exemplary embodiments, but can be modified as appropriate within the scope of the present invention. For example, in the abovementioned exemplary embodiments, an example in which the flip-flop circuit 4 is provided with the transistor 30 and 31 is explained. However, it is not limited to this configuration. The only requirement is that the flip-flop circuit 4 should has a circuit configuration capable of switching the mode between one mode in which the prescaler circuit operates as a conventional flip-flop circuit and another mode in which the prescaler circuit operates in accordance with the logic operation result obtained based on the output signal of the flip-flop circuit 4 and the externally-supplied input signal (output signal from the flip-flop circuit 3). In this case, it is necessary to change the connection of each transistor provided in the flip-flop circuit according to the exemplary embodiment of the present invention so that a prescaler circuit can be formed by connecting a flip-flop circuit according to the exemplary embodiment of the present invention and a conventional flip-flop circuit in cascade.

Moreover, in the abovementioned exemplary embodiment, an example in which the flip-flop circuit 4 is provided with the transistors 43 to 46 as an output driver circuit is explained. However, it is not limited to this configuration. For example, it is also applicable to a circuit having no transistors 43 to 46. In this case, the output terminal Dout of the flip-flop 4 is directly connected to the source of the transistor 49. The output terminal Dout_b of the flip-flop 4 is directly connected to the source of the transistor 47.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A prescaler circuit that divides a frequency of a clock signal by an integer 3 or 4 comprising:
    a first flip-flop circuit that detects second output data in synchronization with the clock signal and outputs the detected data as first output data; and
    a second flip-flop circuit that detects the first output data in synchronization with the clock signal and outputs the detected data as the second output data to the first flip-flop circuit;
    wherein the first flip-flop circuit comprises:
        a master-side latch circuit that generates intermediate data in synchronization with the clock signal;
        a slave-side latch circuit that detects the intermediate data in synchronization with the clock signal and outputs the detected intermediate data as the first output data; and
        the control signal switching circuit that selects and outputs the first output data as a control signal in a mode where the frequency is divided by 3, and selects and outputs a predefined fixed signal as a control signal in a mode where the frequency is divided by 4; and
    wherein the master-side latch circuit generates the intermediate data based on the second output data and the control signal.

2. The prescaler circuit according to claim 1, wherein the master-side latch circuit comprises:
    a first differential circuit provided between a first power supply terminal and a second power supply terminal, an on-off state of the first differential circuit being controlled based on the second output data;
    a second differential circuit provided between the first differential circuit and the first power supply terminal, an on-off state of the second differential circuit being controlled based on the control signal; and
    a third differential circuit provided between the first differential circuit and the first power supply terminal, the third differential circuit being configured to hold and output a drain voltage of the first differential circuit as the intermediate data.

3. The prescaler circuit according to claim 2, wherein the second differential circuit comprises:
    a first transistor provided between a common source of the first differential circuit and the first power supply terminal; and
    a second transistor provided between a drain of the first differential circuit and the first power supply terminal.

4. The prescaler circuit according to claim 3, wherein
    the control signal switching circuit controls an on-off state of the second transistor in accordance with a selected signal between one of a pair of signals constituting the first output data and a first power supply voltage from the first power supply terminal, the selected signal being selected based on the control signal, and
    the control signal switching circuit also controls an on-off state of the first transistor in accordance with a selected signal between the other one of the pair of signals constituting the first output data and a second power supply voltage from the second power supply terminal, the second power supply voltage being different from the first power supply voltage, and the selected signal being selected based on the control signal.

5. The prescaler circuit according to claim 2, further comprising a bias voltage control transistor provided between the second differential circuit and the first power supply terminal.

6. The prescaler circuit according to claim 2, wherein the first differential circuit is formed from a pair of N-channel MOS transistors.

7. The prescaler circuit according to claim 2, wherein the second differential circuit is formed from a pair of N-channel MOS transistors.

8. The prescaler circuit according to claim 2, wherein the third differential circuit is formed from a pair of NPN-type bipolar transistors.

9. A flip-flop circuit comprising:
- a master-side latch circuit that generates intermediate data in synchronization with a clock signal;
- a slave-side latch circuit that detects the intermediate data in synchronization with the clock signal and outputs the detected intermediate data as a first output data; and
- a control signal switching circuit that selects and outputs the first output data as a control signal in a mode where the frequency is divided by 3, and selects and outputs a predefined fixed signal as the control signal in a mode where the frequency is divided by 4; and
- wherein the master-side latch circuit generates the intermediate data based on externally-supplied input data and the control signal.

10. The prescaler circuit according to claim 9, wherein the master-side latch circuit comprises:
- a first differential circuit provided between a first power supply terminal and a second power supply terminal, an on-off state of the first differential circuit being controlled based on the externally-supplied input data;
- a second differential circuit provided between the first differential circuit and the first power supply terminal, an on-off state of the second differential circuit being controlled based on the control signal; and
- a third differential circuit provided between the first differential circuit and the first power supply terminal, the third differential circuit being configured to hold and output a drain voltage of the first differential circuit as the intermediate data.

* * * * *